(12) United States Patent
Bao et al.

(10) Patent No.: US 10,361,132 B2
(45) Date of Patent: Jul. 23, 2019

(54) STRUCTURES WITH THINNED DIELECTRIC MATERIAL

(71) Applicant: GLOBALFOUNDRIES INC., Grand Cayman (KY)

(72) Inventors: Ruqiang Bao, Wappingers Falls, NY (US); Takashi Ando, Tuckahoe, NY (US); Aritra Dasgupta, Wappingers Falls, NY (US); Kai Zhao, Latham, NY (US); Unoh Kwon, Clifton Park, NY (US); Siddarth A. Krishnan, Peerskill, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/476,158

(22) Filed: Mar. 31, 2017

(65) Prior Publication Data
US 2017/0207134 A1 Jul. 20, 2017

Related U.S. Application Data

(62) Division of application No. 14/882,869, filed on Oct. 14, 2015.

(51) Int. Cl.
| | | |
|---|---|---|
| H01L 21/02 | (2006.01) | |
| H01L 21/28 | (2006.01) | |
| H01L 29/49 | (2006.01) | |
| H01L 29/51 | (2006.01) | |
| H01L 21/285 | (2006.01) | |

(Continued)

(52) U.S. Cl.
CPC .......... *H01L 21/823857* (2013.01); *H01L 21/02181* (2013.01); *H01L 21/28088* (2013.01); *H01L 21/28185* (2013.01); *H01L 21/28194* (2013.01); *H01L 21/28556* (2013.01); *H01L 21/31111* (2013.01); *H01L 21/31122* (2013.01); *H01L 21/823842* (2013.01); *H01L 27/092* (2013.01);
(Continued)

(58) Field of Classification Search
CPC ...... H01L 21/82; H01L 27/092; H01L 29/517
USPC ....................................................... 257/369
See application file for complete search history.

(56) References Cited

U.S. PATENT DOCUMENTS

| | | |
|---|---|---|
| 6,087,261 A | 7/2000 | Nishikawa et al. |
| 6,518,203 B2 | 2/2003 | Narwankat et al. |

(Continued)

FOREIGN PATENT DOCUMENTS

| | | |
|---|---|---|
| EP | 614226 A1 | 9/1994 |
| TW | 200607049 A | 4/1994 |

OTHER PUBLICATIONS

Final Office Action in related U.S. Appl. No. 14/882,869 dated Jul. 13, 2017, 11 pages.

(Continued)

*Primary Examiner* — Marvin Payen
*Assistant Examiner* — Vernon P Webb
(74) *Attorney, Agent, or Firm* — Anthony Canale; Andrew M. Calderon; Roberts Mlotkowski Safran Cole & Calderon, P.C.

(57) ABSTRACT

The disclosure relates to semiconductor structures and, more particularly, to structures with thinned dielectric material and methods of manufacture. The method includes depositing a high-k dielectric on a substrate. The method further includes depositing a titanium nitride film directly on the high-k while simultaneously etching the high-k dielectric.

20 Claims, 5 Drawing Sheets

(51) Int. Cl.
   *H01L 21/311* (2006.01)
   *H01L 27/092* (2006.01)
   *H01L 21/8238* (2006.01)

(52) U.S. Cl.
   CPC ...... *H01L 27/0922* (2013.01); *H01L 29/4966* (2013.01); *H01L 29/517* (2013.01)

(56) References Cited

U.S. PATENT DOCUMENTS

| | | |
|---|---|---|
| 6,858,524 B2 | 2/2005 | Haukka |
| 7,122,414 B2 | 10/2006 | Huotari |
| 7,402,480 B2 | 7/2008 | Hebert et al. |
| 8,836,039 B2 | 9/2014 | Suzuki et al. |
| 8,932,923 B2 | 1/2015 | Kim et al. |
| 2004/0023506 A1 | 2/2004 | Pradeep et al. |
| 2005/0260812 A1 | 11/2005 | Kapteyn et al. |
| 2008/0121999 A1 | 5/2008 | Kawahara et al. |
| 2012/0080756 A1* | 4/2012 | Suzuki .................. C23C 16/34 257/369 |
| 2014/0231922 A1 | 8/2014 | Kim et al. |
| 2015/0129972 A1* | 5/2015 | Choi ................ H01L 21/82346 257/369 |

OTHER PUBLICATIONS

Taiwanese Examination Search Report for related TW Application No. 104142076, dated Jun. 23, 2016, 12 pages.
Taiwan Rejection Decision in related Application No. 104142076, dated Nov. 7, 2016, 7 pages.
Taiwanese Office Action in related Taiwanese Application No. 104142076 dated Nov. 28, 2017, 15 pages.
Office Action in related U.S. Appl. No. 14/882,869 dated Dec. 15, 2017, 16 pages.
Taiwanese Notice of Allowance in related Taiwanese Application No. 104142076 dated Jun. 5, 2018, 3 pages.
Final Office Action in related U.S. Appl. No. 14/882,869 dated Jun. 27, 2018, 11 pages.
Chinenese Office Action in related Chinese Application No. 201610054742.1 dated Dec. 3, 2018, 15 pages.

* cited by examiner

STRUCTURES WITH THINNED DIELECTRIC MATERIAL

FIELD OF THE INVENTION

The present disclosure relates to semiconductor structures and, more particularly, to structures with thinned dielectric material and methods of manufacture.

BACKGROUND

A trend in modern integrated circuit manufacture is to produce semiconductor devices, such as field effect transistors (FETs), which are as small as possible. In a typical FET, a source and a drain are formed in an active region of a semiconductor substrate by implanting or p-type impurities in the semiconductor material. Disposed between the source and the drain is a channel (or body) region. Disposed above the body region is a gate electrode. The gate electrode and the body are spaced apart by a gate dielectric layer.

Although the fabrication of smaller transistors allows more transistors to be placed on a single substrate for the formation relatively large circuit systems in a relatively small die area, this downscaling can result in the performance improvement but the degraded reliability. For example, the downscaling of n-channel field effect transistors (nFETs) and p-channel field effect transistors (pFETs) may result in a scaled inversion layer thickness (Tinv) being located between the gate metals and the semiconductor substrate to enhance the performance In scaling of the devices, there remains a conflict to improve the reliability between nFET devices and pFET devices by adjusting dielectric thickness. For example, thinner dielectric material can improve the positive bias temperature instability (pBTI) reliability for nFET devices, whereas, thicker dielectric material can help the negative bias temperature instability (nBTI) reliability for pFET devices. However, it has been found to be difficult to make such adjustments using current technologies.

SUMMARY

In an aspect of the disclosure, a method includes depositing a high-k dielectric on a substrate. The method further includes depositing a titanium nitride film directly on the high-k while simultaneously etching the high-k dielectric.

In an aspect of the disclosure, a method includes depositing a high-k dielectric material on a pFET side and an nFET side of a substrate. The method further includes depositing titanium nitride (TiN) with a precursor of $TiCl_4$ directly on the high-k dielectric material on at least one of the pFET side and the nFET side of the substrate to thin the high-k dielectric material which contacts the $TiCl_4$ TiN In an aspect of the disclosure, structure includes: an nFET device having a high-k dielectric material on a substrate; and a pFET device having the high-k dielectric material on the substrate. The high-k dielectric material of at least one of the nFET device and the pFET device includes Cl and is devoid of C.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to structures with thinned dielectric material and methods of manufacture. More specifically, the present disclosure is directed to atomic (selective) etching of high-k dielectric material, e.g., $HfO_2$, using high temperature $TiCl_4$ TiN for gate dielectric scaling of nFET and pFET devices. Advantageously, in embodiments, the methods described herein provide reliability improvements in scaled devices by, in one implementation, having thicker $HfO_2$ for improved pFET negative bias temperature instability (nBTI) and thinner $HfO_2$ for improved nFET positive bias temperature instability (pBTI).

In embodiments, atomic layer deposition (ALD) TiN is prepared using a $TiCl_4$ precursor at high temperature. By way of an example, HCl is a by-product of high temperature reaction between precursor $TiCl_4$ and precursor $NH_3$ during TiN deposition. High-k materials such as $HfO_2$ cannot be etched by wet HCl processes commonly used; however, the inventors have found that the HCl by-product of the TiCl4TiN deposition under certain conditions allows etching of a high-k film at atomic level control. Accordingly, $TiCl_4$ TiN can be used to thin the dielectric material, e.g., $HfO_2$, in a controllable manner which allows further scaling of the devices and improved reliability. The approaches described herein can be performed either by selective or non-selective etching.

The devices of the present disclosure can be manufactured in a number of ways using a number of different tools. In general, though, the methodologies and tools are used to form structures with dimensions in the micrometer and nanometer scale. The methodologies, i.e., technologies, employed to manufacture the devices of the present disclosure have been adopted from integrated circuit (IC) technology. For example, the structures are built on wafers and are realized in films of material patterned by photolithographic processes on the top of a wafer. In particular, the fabrication of the devices uses three basic building blocks: (i) deposition of thin films of material on a substrate, (ii) applying a patterned mask on top of the films by photolithographic imaging, and (iii) etching the films selectively to the mask.

Figure 1:
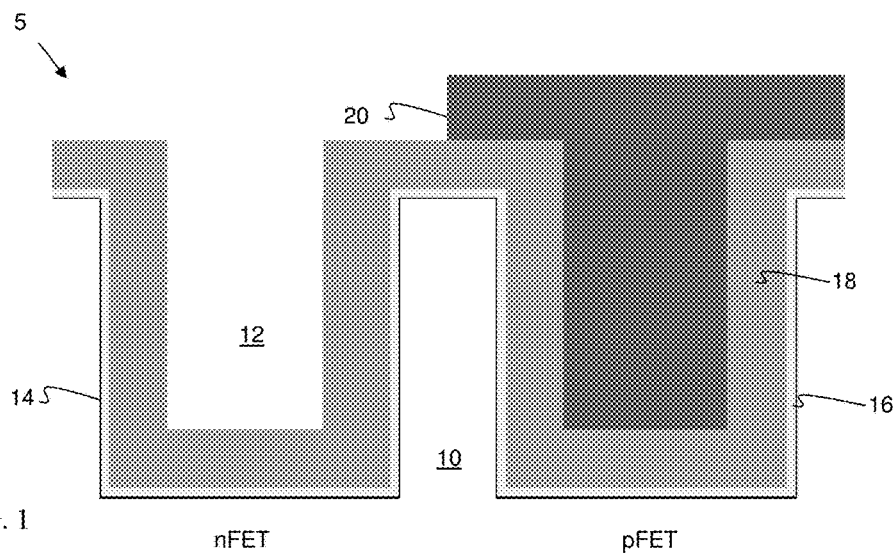
FIGS. 1-3 show structures and respective fabrication processing of nFET and pFET devices in accordance with aspects of the present disclosure.

FIG. 1 shows a structure and respective fabrication processing of nFET and pFET devices in accordance with aspects of the present disclosure. In embodiments, the structure 5 comprises a substrate 10 with a plurality of trenches 12 formed on an nFET side of the substrate 10 and a pFET side of the substrate 10. In embodiments, the substrate 10 can be an oxide material or one or more dielectric materials. The structure 5 can be a planar structure or a finFET structure, as should be understood by those of ordinary skill in the art such that no further explanation is required.

In embodiments, trenches 12 are formed in the substrate 10 on both the nFET side and the pFET side. The trenches 12 can be formed by conventional lithography and etching (e.g., reactive ion etching (RIE) or wets) processes. More specifically, a resist is formed on the substrate 10, and exposed to energy (light) to form a pattern (openings). A reactive ion etching (RIE) or wets is performed through the openings to form the trenches 12. The resist can then be removed by oxygen ashing or other conventional stripants.

Still referring to FIG. 1, an interfacial material 14 is deposited on the substrate 10 and on surfaces within the trenches 12. The interfacial material 14 can be an oxide material, e.g., $SiO_2$. The interfacial material 14 can be formed by any conventional deposition process such as, e.g., chemical vapor deposition (CVD). A dielectric material 16 is formed on the interfacial material 14. The dielectric material 16 is preferably a high-k dielectric material, e.g., hafnium based material ($HfO_2$). The dielectric material 16 can be deposited by an atomic layer deposition (ALD) process; although other deposition processes are also contemplated by the present invention, e.g., CVD or plasma enhanced CVD (PECVD) processes. The dielectric material 16 can be deposited to a thickness of about 1.5 nm to about 3 nm; although other dimensions are also contemplated by the present invention. In embodiments, the dielectric material 16 can undergo a post deposition annealing process.

FIG. 1 further shows a TiN layer 18 formed on the dielectric material 16. In embodiments, the TiN layer 18 can include a metal organic (MO) precursor as should be understood by those of ordinary skill in the art. In embodiments, the TiN layer 18 is deposited to a thickness of about 20 Å to about 50 Å; although other dimensions are also contemplated by the present invention. A resist or mask 20 is formed over the TiN layer 18, on the pFET side. More specifically, the resist or mask 20 is formed on the TiN layer 18, over both the nFET and pFET. The resist 20 is exposed to energy (light) to form a pattern. As shown in FIG. 1, this pattern is an opening exposing the nFET side of the substrate, i.e., exposes the TiN layer 18 on the nFET side.

Figure 2:
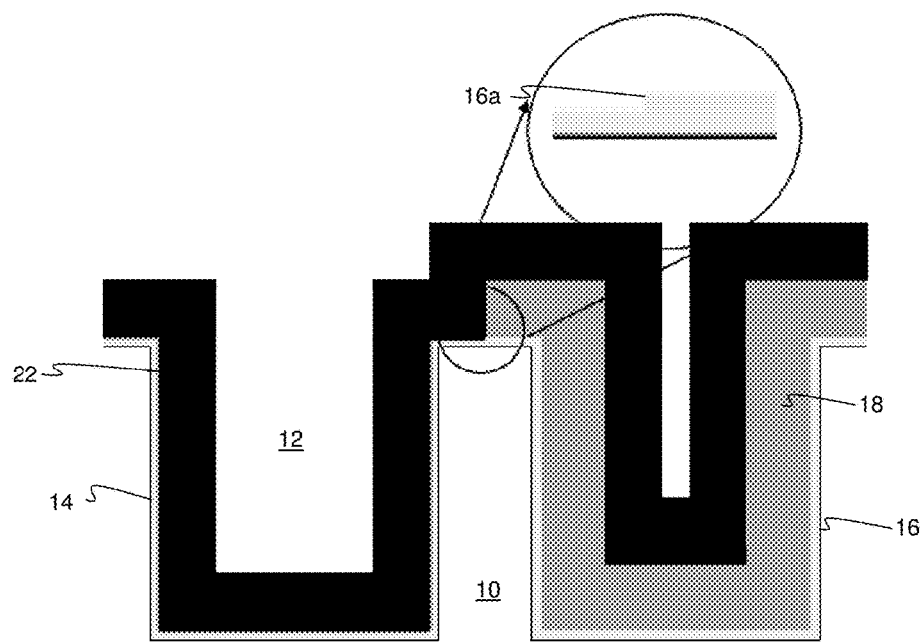

In FIG. 2, the TiN layer 18 on the nFET side is removed using a RIE or wets process. In embodiments, the removal of the TiN layer 18 will expose the underlying dielectric layer 16 on the nFET side of the substrate. It should be understood that the RIE or wets process is selective to the TiN layer 18, and hence does not attack the dielectric layer 16 on the nFET side of the substrate. Following removal of the TiN layer 18 and the resist layer, a layer of TiN material 22 with a precursor is deposited at high temperature on the TiN layer 18 (on the pFET side) and the dielectric layer 16 (on the nFET side). In embodiments, the precursors are $TiCl_4$ and $NH_3$, and the $TiCl_4$ TiN layer 22 (a.k.a. $TiCl_4$ TiN) can be deposited using an ALD or CVD process at a temperature of at or above about 300° C., and more preferably at higher temperature such as 450-500° C. In additional or alternative embodiments, the precursor can be a mixture precursor source of $TiCl_4$ and $NH_3$. In embodiments a range of 0.1 g/min to 1.2 g/min for $TiCl_4$ and 1 slm to 10 slm for $NH_3$ can be used to etch $HfO_2$ in the given temperature range.

It has been found by the inventors that the deposition of the TiN layer 22 (a.k.a. TiCl4 TiN) will thin the underlying dielectric layer 16 on the nFET side of the substrate (i.e., atomic (selective) etching of high-k dielectric material). For example, the inventors have found that the TiN layer 22 (a.k.a. TiCl4 TiN) can etch approximately 3 Å from the underlying dielectric layer 16 on the nFET side of the substrate; whereas, the dielectric layer 16 on the pFET side will remain at its original deposited thickness as shown at the junction represented at reference numeral 16a. More specifically, the dielectric layer 16 on the pFET side of the substrate remains protected by the TiN layer 18 and, hence, will not undergo a thinning process.

Figure 3:
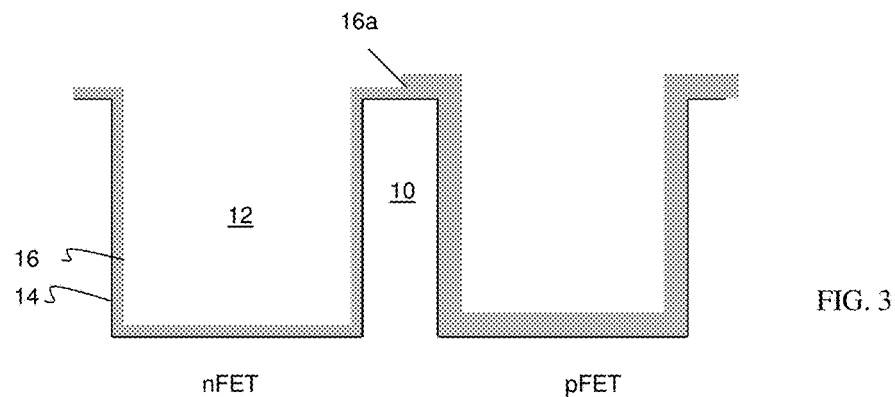

As shown in FIG. 3, the TiN layer 22 (a.k.a. TiCl4 TiN) and TiN layer 18 can be removed to expose the dielectric layer 16 on the pFET side and the nFET side. The structure can then undergo a conventional metal gate process, e.g., deposition of metal fill materials and patterning processes to form gate structures. In this way, a thicker dielectric material, e.g., $HfO_2$, can be used for pFET nBTI, with a thinner dielectric material, e.g., $HfO_2$, used for nFET pBTI.

Figure 4:
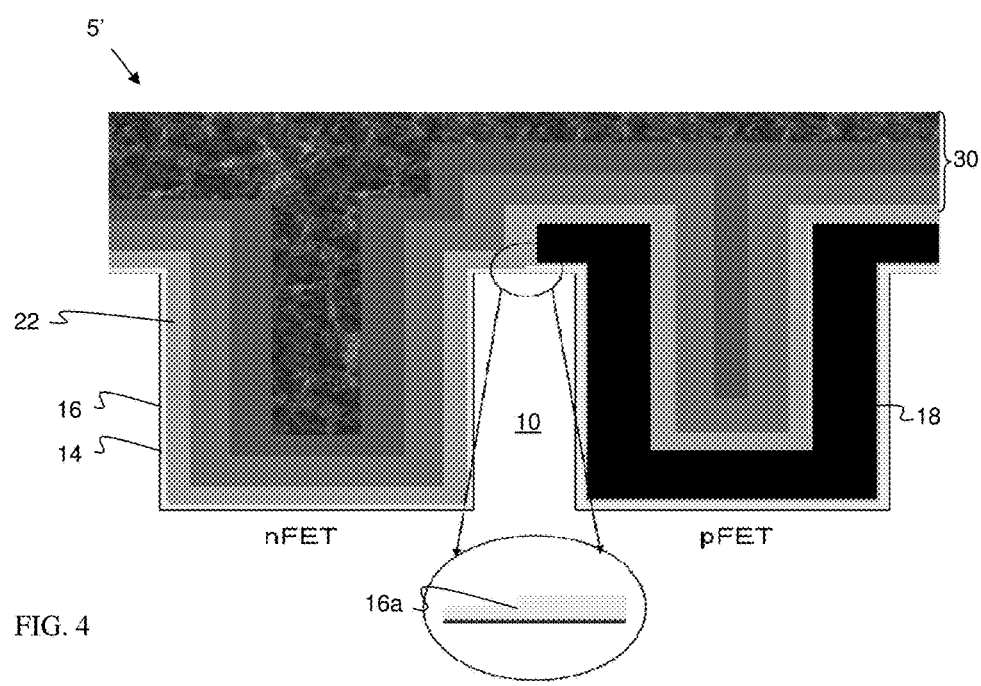
FIG. 4 shows a structure and respective fabrication processing of nFET and pFET devices in accordance with additional aspects of the present disclosure.

FIG. 4 shows an alternative structure and respective fabrication processes in accordance with additional aspects of the disclosure. In the structure 5' of FIG. 4, the TiN layer 22 (a.k.a. TiCl4 TiN) will remain on the dielectric material 16 on both the nFET side and pFET side. Similar to that described with respect to FIGS. 1-3, though, the TiN layer 22 (a.k.a. TiCl4 TiN) (with precursor $TiCl_4$ and precursor $NH_3$ or a mixture of $TiCl_4$ and $NH_3$ precursor) can etch up to approximately 3 Å from the underlying dielectric layer 16 on the nFET side of the substrate; whereas, the dielectric layer 16 on the pFET side will remain at its original deposited thickness as shown at the junction represented at reference numeral 16a (due to the protection afforded by layer 18). An nFET metal stack 30 is then deposited on the TiN layer 22 (a.k.a. TiCl4 TiN). In embodiments, the nFET metal stack 30 can include one of TiAlC, TaAlC, TiAl, Ti and Al, followed by metal fill, e.g., TiN, tungsten, aluminum or other metal fills.

Figure 5A:
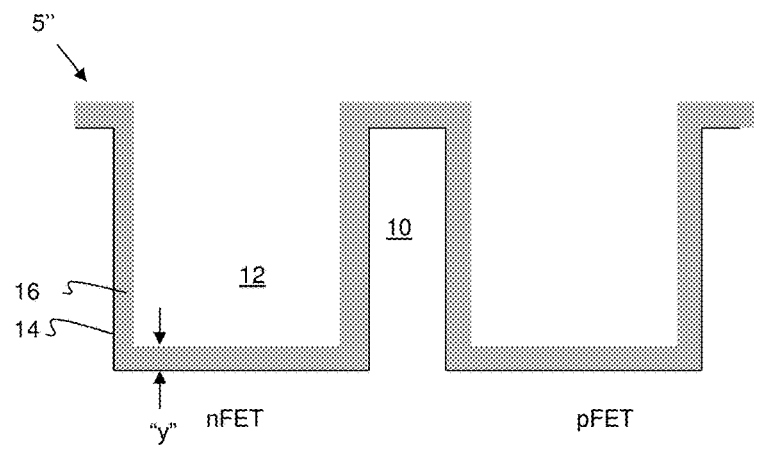
FIGS. 5a-5c show structures and respective fabrication processing of nFET and pFET devices in accordance with further aspects of the present disclosure.
Figure 5B:
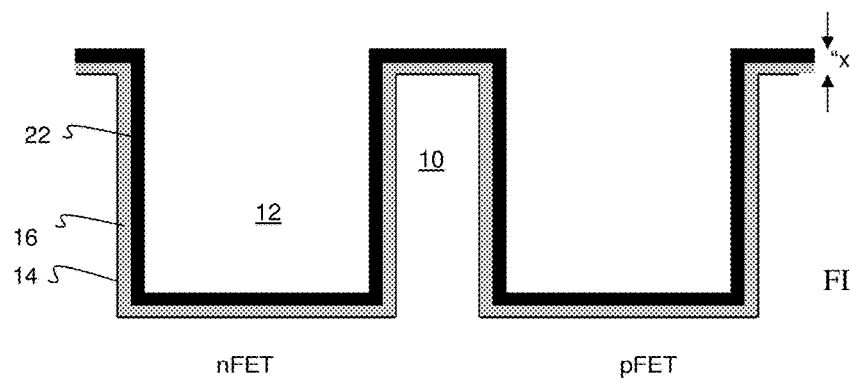
Figure 5C:
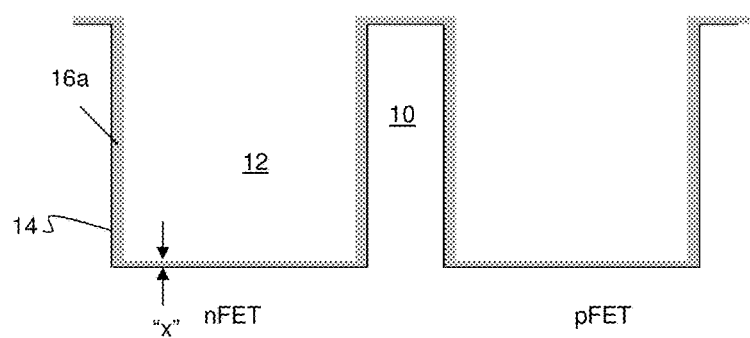

FIGS. 5a-5c show alternative structures and respective fabrication processes in accordance with additional aspects of the disclosure. Similar to that described with respect to FIG. 1, in the structure 5" of FIG. 5a, the interfacial material 14, e.g., $SiO_2$, is deposited on the substrate 10, and within the trenches 12. The dielectric material 16 is formed on the interfacial material 14. The dielectric material 16 is preferably a high-k dielectric material, e.g., $HFO_2$, deposited by an atomic layer deposition (ALD) process to a thickness of about 1.5 nm to about 3 nm (as represented by "y"). In embodiments, the dielectric material 16 can undergo a post deposition annealing process.

As shown in FIG. 5b, TiN layer 22 (a.k.a. TiCl4 TiN) (with precursor $TiCl_4$ and precursor $NH_3$ or a mixtured $TiCl_4$ and $NH_3$ precursor) is deposited at high temperature on the dielectric material 16 on both the nFET side and pFET side. Similar to that described with respect to FIGS. 1-3, the TiN layer 22 (a.k.a. TiCl4 TiN) (with precursor $TiCl_4$ and precursor $NH_3$ or a mixture of $TiCl_4$ and $NH_3$ precursor) can selectively atomic etch up to approximately 3 Å from the underlying dielectric layer 16 to a thinned dimension as represented by "x" (where x<y). In embodiments, the etching can be greater than 3 Å, depending on the nucleation time of TiN. Once the uniform TiN is formed on the dielectric layer 16, e.g., $HfO_2$, the etch will be stopped. As the TiN layer 22 (a.k.a. TiCl4 TiN) is deposited on both the nFET side and the pFET side, the dielectric layer 16 will now be thinned on both sides of the device as representatively shown in FIGS. 5b and 5c by reference "x". In FIG. 5c, the TiN layer is removed using a conventional etching process. A metal fill process can then follow for the formation of nFET and pFET gate stacks.

Figure 6:
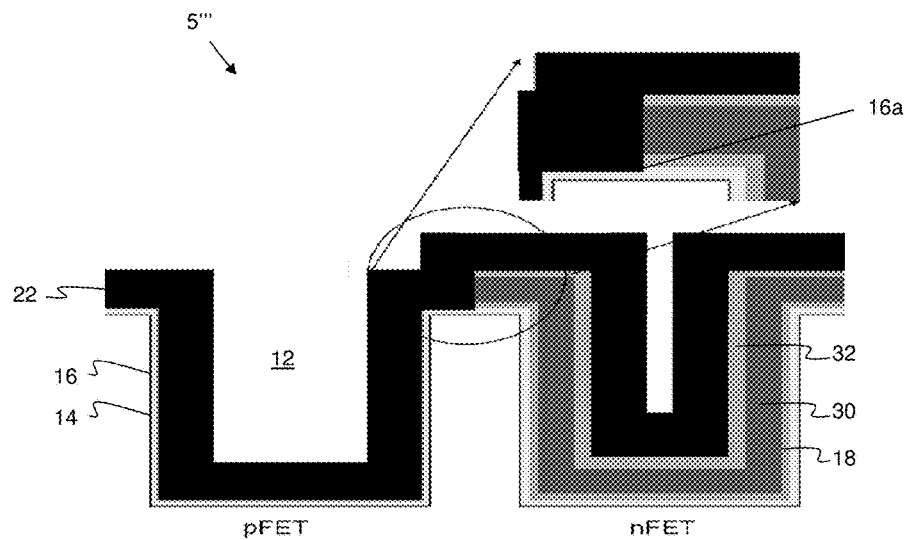
FIG. 6 shows a structure and respective fabrication processing of nFET and pFET devices in accordance with yet further aspects of the present disclosure.

FIG. 6 shows a structure with a different polarity as compared to the structure shown in FIGS. 1-3. In particular, the structure 5''' of FIG. 6 shows a thinning of the dielectric material 16 on the pFET side of the substrate (i.e., atomic (selective) etching of high-k dielectric material 16). To this end, it should be understood that pFET leakage is much lower than nFET leakage due to band gap offset of the $HfO_2$. Accordingly, if pFET reliability is not an issue, the thickness of the dielectric material (e.g., $HfO_2$) on the pFET side of the substrate can be thinned to provide improved scaling in accordance with aspects of the present disclosure.

More specifically and similar to that shown and described in FIG. 1, interfacial material 14, e.g., $SiO_2$, is deposited on the substrate 10 and within the trenches 12. The dielectric material 16 is formed on the interfacial material 14. The dielectric material 16 is preferably a high-k dielectric material, e.g., $HfO_2$, deposited by ALD processes; although other deposition processes are also contemplated by the present invention, e.g., CVD or PECVD processes. The dielectric material 16 can be deposited to a thickness of about 1.5 nm to about 3 nm; although other dimensions are also contemplated by the present invention. In embodiments, the dielectric material 16 can undergo a post deposition annealing process.

Still referring to FIG. 6, a barrier layer 18, e.g., MO TiN or PVD TiN, is formed on the dielectric material 16, followed by nFET metals, e.g., a layer 30 (e.g., TiAlC, TaAlC, TiAl, Ti and Al), and a capping layer 32, e.g., TiN layer. The layers 18, 30 and 32 can be deposited by conventional deposition processes, e.g., ALD. In embodiments, the layer 18 can be deposited to a thickness of about 10 Å or less, the layer 30 can be deposited to a thickness of about 20 Å to 100 Å and the layer 32 can be deposited to a thickness of about 1.5 nm to 3 nm; although other dimensions are contemplated herein. After deposition, the layers 18, 30 and 32 can be patterned, e.g., removed from the pFET side of the substrate, by conventional lithography and etching (RIE) processes. The patterning process will expose the dielectric material 16 on the pFET side of the substrate.

Following removal of the layers 18, 30, 32 on the pFET side, a layer of TiN layer 22 (a.k.a. TiCl4 TiN) with precursors (e.g., precursor $TiCl_4$ and precursor $NH_3$ or a mixture of $TiCl_4$ and $NH_3$ precursor) is deposited at high temperature on the capping layer 32 on the nFET side and the dielectric layer 16 on the pFET side of the substrate. As previously described, the precursor for the TiN layer 22 (a.k.a. TiCl4 TiN) is a high temperature $TiCl_4$, and the $TiCl_4$ TiN layer 22 (a.k.a. TiCl4 TiN) can be deposited using an ALD or CVD process at a temperature of at or above about 350° C., and more preferably at or about 390° C., and more preferably about 450° C. In additional or alternative embodiments, the precursor can be a mixtured precursor of $TiCl_4$ and $NH_3$.

As already described herein, it has been found by the inventors that the TiN layer 22 (a.k.a. TiCl4 TiN) will thin (i.e., atomically etch) the underlying dielectric layer 16, which in this embodiment will be on the pFET side of the substrate. For example, the inventors have found that the TiN layer 22 (a.k.a. TiCl4 TiN) can etch approximately 3 Å from the underlying dielectric layer 16 on the pFET side of the substrate; whereas, the dielectric layer 16 on the nFET side will remain at its original deposited thickness as shown at the junction represented by reference numeral 16a. The processes can continue with a metal fill process after the removal of the TiN layer 22 (a.k.a. TiCl4 TiN).

As discovered by the inventors, in each of the embodiments using the processes described herein, e.g., TiN layer 22 (a.k.a. TiCl4 TiN), Cl can be found contained in the deposited TiN film and dielectric material 16 but with no C. In comparison, in conventional processes using MO TiN with a precursor of $NH_3$, C can be found contained in the deposited TiN and the dielectric material 16. In a further comparison with a conventional PVD TiN with a Ti target and $N_2$ gas precursor, Cl, C, or O cannot be found in the deposited TiN and C cannot be found in the underlying dielectric material. Accordingly, the structures described herein can be distinguished from a compositional standpoint by noting whether Cl and C can be found in the TiN or C can be found in the underlying dielectric material. In embodiments, the high-k material may act as a gate material for a transistor of a semiconductor device.

Figure 7:
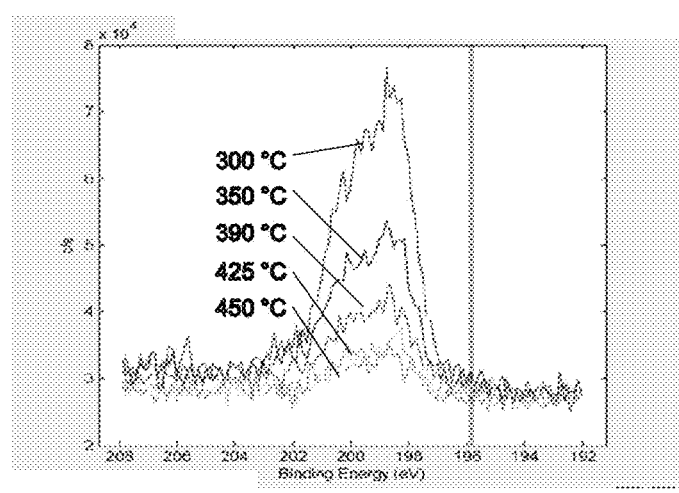
FIG. 7 shows Cl concentration in a dielectric film when implementing the processes as described in the present disclosure.

More specifically, FIG. 7 shows Cl concentration in the deposited TiCl4 TiN, when implementing the processes as described in the present disclosure. As shown in FIG. 7, concentration of Cl is shown to be reduced at deposition temperatures of between 300° C. to 450° C.

Figure 8:
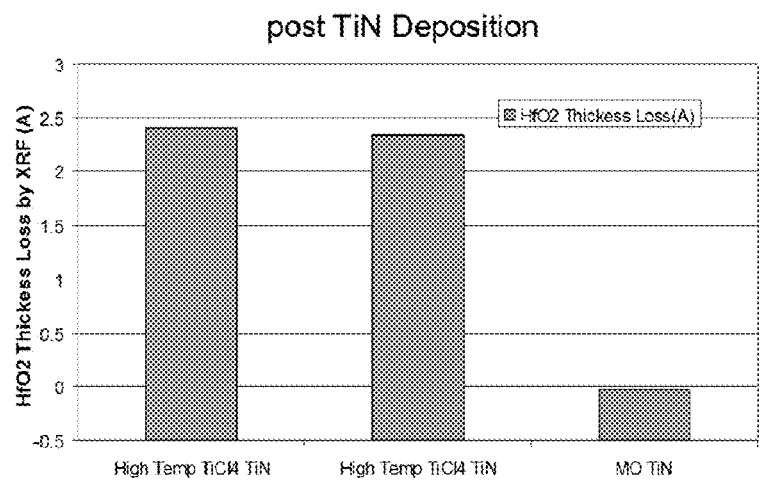
FIG. 8 shows a graph comparing dielectric thickness, post deposition of metal-organic (MO) TiN and high temperature $TiCl_4$ TiN.

FIG. 8 shows a graph comparing dielectric thickness, post deposition of MO TiN and $TiCl_4$ TiN deposited at high temperature in accordance with aspects of the disclosure. As shown from this graph, dielectric thickness loss (i.e., thickness) after deposition of the high temperature $TiCl_4$ TiN was about 2.5 Å, compared to no thickness loss of dielectric material for MO TiN.

Figure 9:
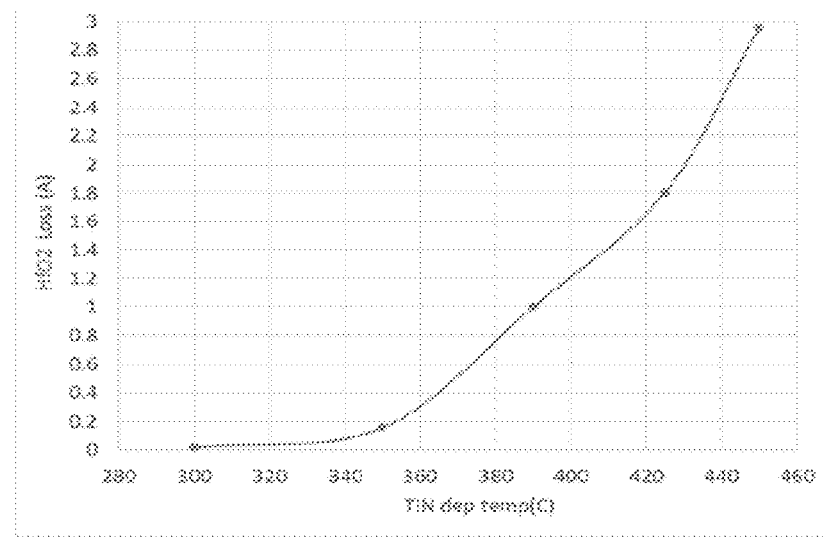
FIG. 9 shows a graph comparing dielectric loss (thickness loss) versus deposition temperature of $TiCl_4$ TiN.

FIG. 9 shows a graph comparing dielectric loss (thickness loss) versus deposition temperature of $TiCl_4$ TiN. In this graph, the y-axis represents loss of dielectric material, e.g., $HfO_2$, and the x-axis represents deposition temperature of $TiCl_4$ TiN. As shown in this graph, dielectric loss increases with deposition temperature. For example, dielectric loss of about 1 Å occurs at a deposition temperature of about 390° C.; whereas, dielectric loss of about 3.0 Å occurs at a deposition temperature of about 450° C.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method comprising:
depositing a high-k dielectric on a substrate; and
depositing a titanium nitride film directly on a portion of the high-k dielectric which simultaneously etches the high-k dielectric to thin the high-k dielectric, with remaining portions of the high-k dielectric which are devoid of the titanium nitride film remaining at an original thickness, including at a pFET side comprising an intervening layer which prevents the titanium nitride film from being deposited directly on the remaining portions of the high-k dielectric.

2. The method of claim 1, wherein the depositing the TiN further includes using a precursor containing $TiCl_4$.

3. The method of claim 2, wherein the precursor further comprises $NH_3$.

4. The method of claim 2, wherein the TiN with precursor is deposited at a temperature of at or above about 300° C.

5. The method of claim 4, wherein the TiN with precursor is deposited at a temperature of about 500° C.

6. The method of claim 2, further comprising depositing material directly on the high-k dielectric on a pFET side prior to the etching such that the material blocks the TiN with precursor from being deposited directly on the high-k dielectric on the pFET side, and only the high-k dielectric on an nFET side of the substrate is thinned by exposing the high-k dielectric on the nFET side to the TiN with precursor.

7. The method of claim 6, wherein the material is deposited on the nFET side of the substrate and subsequently removed to expose the high-k dielectric on the nFET side of the substrate for the TiN with precursor to be deposited directly on the high-k dielectric on the nFET side.

8. The method of claim 1, wherein the high-k dielectric is etched on both a pFET side and an nFET side by depositing the TiN film on exposed portions of the high-k dielectric.

9. The method of claim 1, wherein the high-k dielectric is $HfO_2$.

10. A method comprising:
depositing a high-k dielectric material on a pFET side and an nFET side of a substrate; and
depositing titanium nitride (TiN) with a precursor of $TiCl_4$ directly on the high-k dielectric material on at least one of the pFET side and the nFET side of the substrate to thin the high-k dielectric material which contacts the $TiCl_4$ TiN, with another portion of the high-k dielectric remaining at its original thickness by the remaining portion being protected from the $TiCl_4$ TiN by a stack of materials comprising a barrier layer and a capping layer at the pFET side.

11. The method of claim 10, wherein the precursor further comprises $NH_3$.

12. The method of claim 10, wherein the high-k dielectric is $HfO_2$.

13. The method of claim 10, wherein the TiN $TiCl_4$ is deposited at a temperature of at or above about 300° C.

14. The method of claim 13, wherein the TiN $TiCl_4$ is deposited at a temperature of about 500° C.

15. The method of claim 10, further comprising depositing material directly on the high-k dielectric material on the pFET side such that the material blocks the $TiCl_4$ TiN from being deposited directly on the high-k dielectric on the pFET side, and only the high-k dielectric on the nFET side of the substrate is thinned.

16. The method of claim 15, wherein the material is deposited on the nFET side of the substrate and subsequently removed to expose the high-k dielectric on the nFET side of the substrate for the $TiCl_4$ TiN to thin the high-k dielectric only on the nFET side.

17. The method of claim 10, wherein the material is TiN.

18. The method of claim 10, wherein the high-k dielectric is etched on both the pFET side and the nFET side by depositing the $TiCl_4$ TiN on exposed portions of the high-k dielectric on both the pFET side and the nFET.

19. The method of claim 1, wherein the titanium nitride film is removed to expose the thinned high-k dielectric.

20. The method of claim 19, wherein the exposed high-k dielectric comprises a junction at the portion of the high-k dielectric which remains at the original thickness.

* * * * *